(12) United States Patent
Lin et al.

(10) Patent No.: US 10,804,263 B2
(45) Date of Patent: Oct. 13, 2020

(54) SWITCHING FIELD PLATE POWER MOSFET

(71) Applicant: Texas Instruments Incorporated, Dallas, TX (US)

(72) Inventors: Haian Lin, Bethlehem, PA (US); Frank Baiocchi, Allentown, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 2 days.

(21) Appl. No.: 15/274,402

(22) Filed: Sep. 23, 2016

(65) Prior Publication Data

US 2018/0090490 A1 Mar. 29, 2018

(51) Int. Cl.
*H01L 27/088* (2006.01)
*H01L 29/40* (2006.01)
(Continued)

(52) U.S. Cl.
CPC ...... *H01L 27/0883* (2013.01); *H01L 21/8236* (2013.01); *H01L 29/1087* (2013.01); *H01L 29/402* (2013.01); *H01L 29/4175* (2013.01); *H01L 29/7831* (2013.01); *H01L 29/7835* (2013.01); *H01L 21/26586* (2013.01); *H01L 29/0696* (2013.01); *H01L 29/1045* (2013.01); *H01L 29/404* (2013.01)

(58) Field of Classification Search
CPC ... H01L 29/402; H01L 29/404; H01L 29/405; H01L 29/7835; H01L 29/7836; H01L 27/0883
See application file for complete search history.

(56) References Cited

U.S. PATENT DOCUMENTS 7,589,378 B2  11/2009  Kocon et al.
8,288,820 B2  10/2012  Kocon et al.
(Continued)

OTHER PUBLICATIONS

Korec, Jacek et al. "History of FET Technology and the Move to NexFET," Bodo's Power Systems, May 2009, pp. 44-46, Issue 4.
(Continued)

*Primary Examiner* — Sue A Purvis
*Assistant Examiner* — Scott Stowe
(74) *Attorney, Agent, or Firm* — Jacqueline J. Garner; Charles A. Brill; Frank D. Cimino (57) ABSTRACT

A power MOSFET IC device including a source-down enhancement mode transistor formed in a semiconductor substrate and a depletion mode transistor formed in a doped region of the semiconductor substrate. A gate terminal of the depletion mode transistor is formed over at least a portion of the doped region as a field plate that is switchably connectable to a source terminal of the source-down enhancement mode transistor. A control circuit may be provided to facilitate a connection between the gate terminal of the depletion mode transistor and the source terminal of the source-down enhancement mode transistor when the power MOSFET integrated circuit is in an OFF state. The control circuit may also be configured to facilitate connection of the gate terminal of the depletion mode transistor to a gate terminal of the source-down enhancement mode FET device or to an external driver that provides a reference voltage, when the power MOSFET is in an ON state.

19 Claims, 7 Drawing Sheets

(51) Int. Cl.
*H01L 29/10* (2006.01)
*H01L 21/8236* (2006.01)
*H01L 29/78* (2006.01)
*H01L 29/417* (2006.01)
*H01L 21/265* (2006.01)
*H01L 29/06* (2006.01)

(56) References Cited

U.S. PATENT DOCUMENTS

| | | |
|---|---|---|
| 8,853,029 B2 | 10/2014 | Denison et al. |
| 2014/0264431 A1* | 9/2014 | Lal .................. H01L 27/0883 257/121 |

OTHER PUBLICATIONS

Korec, Jacek et al. "Next Generation of Power MOSFETs," Power Electronics Europe, 2009, pp. 26-28, Issue 4.

* cited by examiner

SWITCHING FIELD PLATE POWER MOSFET

FIELD OF THE DISCLOSURE

This disclosure relates generally to the field of semiconductor devices and the methods of fabrication thereof, and more particularly, without limitation, to a switching field plate power MOSFET device and its fabrication.

BACKGROUND

A power MOSFET is a specific type of metal oxide semiconductor field-effect transistor designed to handle significant power levels (e.g., typically involving switching of more than 1A). Power MOSFETs are well known for superior switching speed, and are used in many applications such as power supplies, DC-to-DC converters, low-voltage motor controllers, as well as switches in other high-frequency pulse width modulation (PWM) applications, and the like.

Efficiency and power loss in microelectronic devices including power MOSFETs is a major issue in power electronics applications. Engineers are continually challenged to increase power density and at the same time reduce the amount of power dissipated in the applications to keep maximum temperatures under specifications, which has given rise to a constant demand for better operational efficiencies in power MOSFET applications. For example, traditional approaches to improve efficiency in DC/DC synchronous buck converters include reducing conduction losses in the MOSFETs through designing lower on-state resistance ($R_{DSON}$) devices and lowering switching losses through reducing device capacitances. However, current technologies to achieve incremental improvements in $R_{DSON}$ are at a point of diminishing returns because of the trade-off required between the device's breakdown voltage and its on-state resistance, since the higher the breakdown voltage designed into the device, the larger the resistive contribution.

As the advances in the design of integrated circuits and semiconductor fabrication continue to take place, improvements in semiconductor devices, including power MOSFETs, are also being concomitantly pursued.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

In one aspect, an embodiment of a power MOSFET integrated circuit is disclosed, which comprises, inter alia, a semiconductor substrate, a source-down enhancement mode transistor formed in the semiconductor substrate; and a depletion mode transistor formed in a doped region of the semiconductor substrate (e.g., a lightly doped drain region having a doping concentration lighter than a drain region, in one example implementation) and serially coupled to the enhancement mode transistor. In one example configuration, the doped region includes a drain terminal, the depletion mode transistor comprising a gate terminal formed over at least a portion of the doped region as a field plate that is switchably connectable to a source terminal of the source-down enhancement mode transistor. A control circuit may be provided to control the field plate gate terminal of the depletion mode transistor depending on whether the power MOSFET is in an ON or OFF state.

In another aspect, an embodiment of a method of fabricating a power MOSFET integrated circuit is disclosed, which comprises, inter alia, forming a source-down enhancement mode transistor in a semiconductor substrate, and forming a depletion mode transistor in a doped region (e.g., LDD) of the semiconductor substrate, the depletion mode transistor electrically coupled in series to the source-down enhancement mode at a portion in the doped region. The doped region is formed to include a drain terminal, wherein a gate terminal of the depletion mode transistor is formed over at least a portion of the doped region as a field plate that is switchably connectable to a source terminal of the source-down enhancement mode transistor.

In another aspect, an embodiment of a laterally diffused metal-oxide-semiconductor transistor (LDMOS) device is disclosed that comprises, inter alia, a semiconductor substrate having a top surface and a bottom surface, the semiconductor substrate having a doped layer positioned adjacent to the top surface and having an upper surface; source and drain regions of a first conductivity type formed in the doped layer proximate the upper surface of the doped layer, the source and drain regions being spaced from one another and separated by a channel region of a second conductivity type formed in the doped layer, the channel region having a portion extending under the source region, wherein the drain region comprises a doped drain (e.g., LDD) region formed adjacent to the channel region; a doped drain contact region spaced from the channel region by the lightly doped drain region; a conductive gate having an upper surface and sidewall surfaces, the conductive gate formed over a gate dielectric layer formed over the channel region, the conductive gate partially overlapping the source and drain regions; a conducting path connecting the source region and the doped substrate via a conductor disposed in a trench; a first insulating layer formed over the upper surface and sidewall surfaces of the conductive gate; a field plate over the lightly doped drain region, wherein the field plate is switchably connectable to the source; a second insulating layer formed over the transistor device, including over the field plate, the first insulating layer and the trench; and a drain electrode electrically coupled to the drain contact region.

In a still further aspect, an embodiment of a semiconductor device comprising a power MOSFET cell integrated with suitable FP gate control circuitry is disclosed. The claimed device comprises, inter alia, a semiconductor substrate; a power MOSFET cell having a source-down enhancement mode transistor formed in the semiconductor substrate and a depletion mode transistor formed in a doped region (e.g., LDD region) of the semiconductor substrate, the source-down enhancement transistor and the depletion mode transistor electrically coupled in series, the depletion mode transistor comprising a field plate operative as a gate terminal formed over at least a portion of the doped region and switchably connectable to a source terminal of the source-down enhancement mode transistor; a first control FET and a second control FET formed in the semiconductor substrate, the first and second control FETs operative to control the field plate gate terminal of the depletion mode transistor depending on whether the power MOSFET cell is in ON state or OFF state, wherein a source of the first control FET is electrically isolated from a source of the power MOSFET cell and a source of the second control FET is commonly tied to the source of the power MOSFET cell.

BRIEF DESCRIPTION OF THE DRAWINGS

Embodiments of the present disclosure are illustrated by way of example, and not by way of limitation, in the Figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing Figures in which:

DETAILED DESCRIPTION OF THE DRAWINGS

The present invention is described with reference to the attached Figures wherein like reference numerals are generally utilized to refer to like elements throughout. The Figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

In the following description, reference may be made to the accompanying drawings wherein certain directional terminology, such as, e.g., "upper", "lower", "top", "bottom", "left-hand", "right-hand", "front side", "backside", "vertical", "horizontal", etc., may be used with reference to the orientation of the Figures or illustrative elements thereof being described. Since components of embodiments can be positioned in a number of different orientations, the directional terminology is used for purposes of illustration and is in no way limiting. Likewise, references to features referred to as "first", "second", etc., are not indicative of any specific order, importance, and the like, and such references may be interchanged mutatis mutandis, depending on the context, implementation, etc. It is understood that further embodiments may be utilized and structural or logical changes may be made without departing from the scope of the present invention. The features of the various exemplary embodiments described herein may be combined with each other unless specifically noted otherwise.

As employed in this specification, the terms "coupled", "electrically coupled", "connected" or "electrically connected" are not meant to mean that elements must be directly coupled or connected together. Intervening elements may be provided between the "coupled", "electrically coupled", "connected" or "electrically connected" elements.

Example semiconductor devices described below may include or formed of a semiconductor material like Si, SiC, SiGe, GaAs or an organic semiconductor material. The semiconductor material may be embodied as a semiconductor wafer or a semiconductor chip containing a number of power MOSFET integrated circuits, input/output and control circuitry, as well as microprocessors, microcontrollers, and/or micro-electro-mechanical components or systems (MEMS), inter alia. The semiconductor chip may further include inorganic and/or organic materials that are not semiconductors, for example, insulators such as dielectric layers, plastics or metals, etc.

Figure 1:
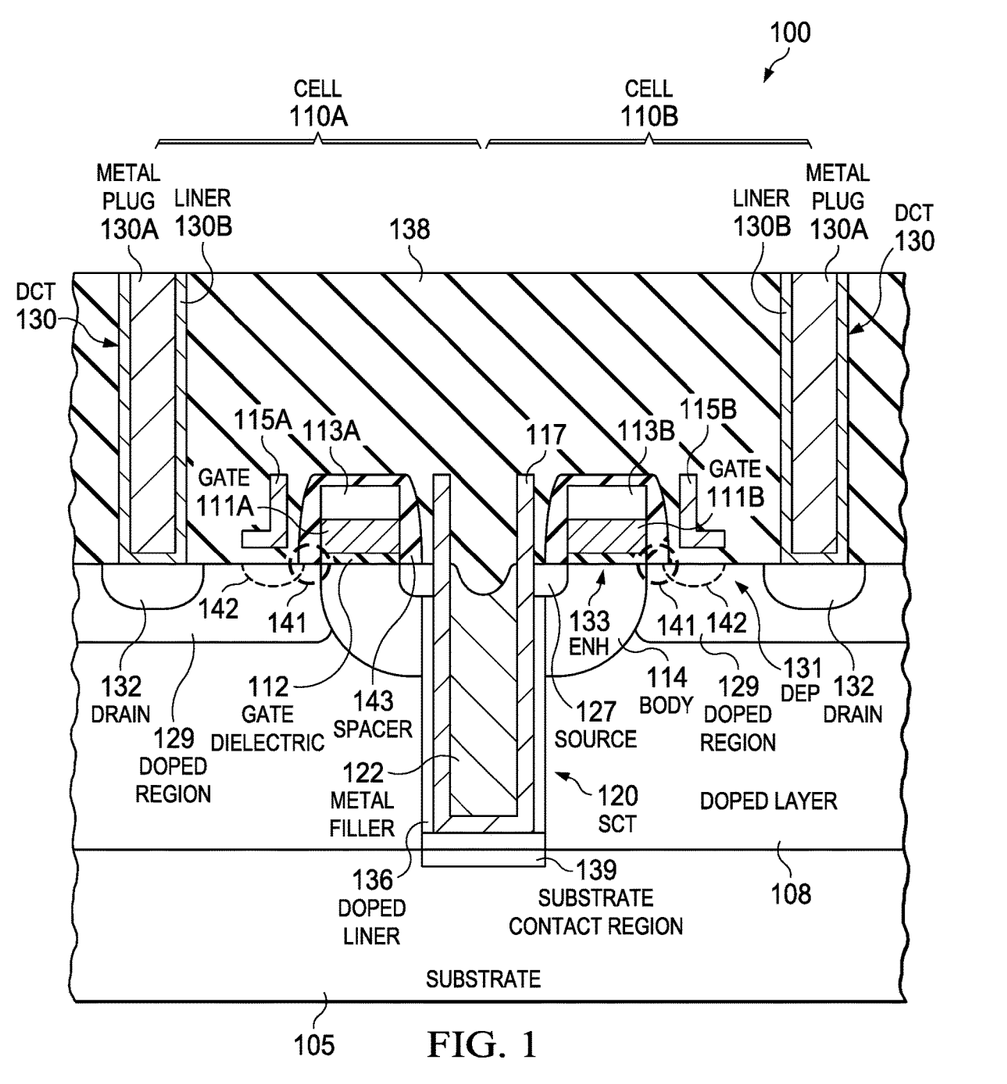
FIG. 1 depicts a cross-sectional view of a portion of an example power MOSFET device according to an embodiment of the present invention.

Referring now to the drawings and more particularly to FIG. 1, depicted therein is a cross-sectional view of a portion of an example power MOSFET device 100 according to an embodiment of the present invention. By way of illustration, example power MOSFET device 100 is shown as a planar gate power MOSFET device having a metal-filled deep source contact (SCT) 120 that may be formed in a trench of a semiconductor substrate material. In an example implementation, deep source contact 120 may be formed as a metallic plug comprising a refractory metal or a platinum-group metal (PGM) filler 122 that connects a source region 127 formed in a body 114 of a power MOSFET cell 110A or 110B to a substrate contact region 139. In one example embodiment, tungsten may be used as a refractory metal filler. As known in material science, the identifying feature of refractory metals is their resistance to heat, where the five industrial refractory metals (Molybdenum (Mo), Niobium (Nb), Rhenium (Re), Tantalum (Ta) and Tungsten (W)) all have melting points in excess of 2000° C., with tungsten having a melting point of 3422° C. Example PGMs include Iridium (Ir), Osmium (Os), Palladium (Pd), Platinum (Pt) and Rhodium (Rh), with Pt and Pd have melting points of 1,769° C. and 1,554° C., respectively. Such melting points may be compared to Aluminum (Al) (not a refractory metal or a PGM) which has a melting point of only 660° C., and is thus not ideal for forming a metal filler for a disclosed metal filled deep SCT 120.

Power MOSFET 100 includes a doped layer positioned near the top surface, e.g., a layer provided as an epitaxial (epi) layer 108 on a semiconductor substrate 105. As previously noted, the substrate 105 and/or epi layer 108 can comprise silicon, silicon-germanium, or other semiconductor material. In certain additional or alternative embodiments, however, MOSFET 100 can be formed directly on a substrate 105, such as a substrate comprising bulk silicon with an appropriate doping concentration. One embodiment comprises an epi layer 108 that is lightly doped and with an epi layer thickness designed to increase the device breakdown voltage, on a more heavily doped substrate 105, which is contacted by adjustment of the SCT trench depth.

Accordingly, in an embodiment of the present invention, power MOSFET 100 may be considered as a semiconductor structure having a suitably doped substrate (e.g., substrate 105) having bottom and top surfaces and a doped layer (e.g., epi 108) positioned adjacent to the top surface and having an upper surface, wherein source and drain regions of a first conductivity type may be formed in the doped layer proximate the upper surface of the doped layer, the source and drain regions being spaced from one another and separated by a channel region of a second conductivity type formed in the doped layer, the channel region having a portion extending under the source region, and further wherein the drain region comprises a doped region 129 formed adjacent to the channel region formed in a body. In one example implementation, doped region 129 comprises a lightly doped drain (LDD) having a concentration lighter than a drain region, and may preferably be engineered to achieve one or more of: (i) suppression of parasitic capacitance; (ii) reduction of the intensity of electric field in drain; and/or (iii) reduced probability of formation of hot electrons.

Power MOSFET 100 includes a drain 132 formed in such a doped region (e.g., LDD region) extending from body 114 in the epi layer 108. Whereas example embodiments hereinbelow may particularly describe an LDD region, one skilled in the art will recognize that the scope of the present invention is not limited to such examples only. Drain 132 is provided with a drain contact (DCT) 130, which may also comprise a metal plug 130A with barrier metal liner 130B (e.g., Ti/TiN). Surrounding and coupled to the deep SCT 120 is source region 127 that is generally formed by ion implantation, to which the deep SCT 120 provides a low resistance contact. The deep SCT 120 connects the source 127 to the epi layer 108 or substrate 105 via a highly doped substrate contact region 139 (doped p+ for P-type substrates) at a bottom of the deep SCT 120 (optionally through a thin region of epi layer 108) so that during operation when the power MOSFET 100 is turned ON, current can flow vertically down and out the back of the substrate 105 (die) with minimal resistance (in an example source-down implementation).

To the external circuitry, accordingly, the backside of the substrate 105 is generally operative as the source pin, and the topside metal (that will be on top of the dielectric layer(s) 138 and extending into a drain contact through the dielectric layer 138 to the drain 132) is operative as the drain pin. As noted above, at the bottom of the deep SCT 120 is a substrate contact region 139 that is generally an implanted region formed after the etching of the trench for the deep SCT 120, which is doped the same type as the epi layer 108. The boron doping level for substrate contact region 139 can be around $1\times10^{20}$ cm$^{-3}$ (for example, $5\times10^{19}$ cm$^{-3}$ to $1\times10^{21}$ cm$^{-3}$) to provide a low resistance ohmic contact to the substrate 105. Two power MOSFET cells 110A and 110B are shown that function as power MOSFET device building blocks, each being defined from the midpoint of the deep SCT 120 to the midpoint of the DCT 130 in this example arrangement shown in FIG. 1. However, a skilled artisan will recognize that a practical power MOSFET device may be considered a 2D transistor array, as there may be hundreds or thousands of individual active MOSFET cells coupled together electrically in parallel. A 2D transistor array to form the power MOSFET device is generally built up in circuit design by repetitive mirror images of the unit cells 110A, 110B.

Power MOSFET cells 110A/110B also include respective gate electrodes or gate stacks, e.g., gates 111A, 111B, formed over a suitable gate dielectric layer 112. Additionally or alternatively, an optional silicide layer 113A/113B may be provided as part of the gate stack of a cell. Regardless of whether a stack is implemented, gate electrodes of the power MOSFET cells 110A/110B are separately electrically tied together by another metal or doped polycrystalline element (not shown), which may be generally connected to the gate electrode terminal of the device package. As the transistor array is generally built up by repetitive mirror images of this unit cell, it will be appreciated that one DCT 130 shares two gates on either side, just as one deep SCT 120 shares two gates on either side, as shown in the example arrangement of FIG. 1.

A source field plate 117 may be provided as part of the deep SCT structure 120 to operate as a source metal wrapping or extension adjacent to the respective gate electrodes of the power MOSFET cells 110A/110B. Further, in accordance with the teachings of the present patent application, a field plate that is preferably formed as part of a mask layer for fabricating the source field plate 117 but without being electrically coupled thereto may be provided or otherwise formed over at least a portion of the LDD region 129 of each MOSFET cell 110A/110B. In the example embodiment of FIG. 1, reference numerals 115A and 115B respectively refer to the two such LDD field plates, which can be selectably and switchably controlled as will be described in additional detail hereinbelow.

In one example implementation, source field plate (SFP) 117 may comprise a refractory metal material layer or refractory metal material layer stack such as TiN/Ti. Likewise, as part of the same FP mask layer, LDD FPs 115A/115B may also comprise similar metallurgies although they are electrically isolated from SFP structures 117. Additionally, such refractory metal materials may also be provided at the bottom of the deep SCT 120. In an example fabrication flow, a rapid thermal anneal (RTA) step can be performed after TiN/Ti deposition, which for a silicon epi layer 108 leads to titanium silicide formation at the Ti/Si interface. This, in addition to a proper (e.g., sufficiently high) doping concentration, can provide good ohmic contact between the deep SCT 120 and the epi layer 108 (or substrate 105).

Continuing to refer to the cross-sectional view of FIG. 1, fabrication of an example power MOSFET device 100 may include forming one or more dielectric layer(s) 138 above the gate stacks 111A/113A and 111B/113B as well as surrounding and/or overlying SFP 117 and LDD FPs 115A/115B. Typically, such dielectric layers 138 may comprise a dielectric stack formed of one or more deposited silicon oxide layers (e.g., Tetraethyl Orthosilicate (TEOS) derived, boron and phosphorous doped TEOS (BPTEOS)/TEOS) layers), which may be based on standard interlevel dielectric processing (deposition/lithography/etching).

In one example implementation, a tilted implant step may also be provided that facilitates tilted implant of appropriate species into the sidewall region of the SCT trench 120 to form a doped liner 136. One skilled in the art will recognize that such a tilted implant may help reduce the resistance between the body region 113 (e.g., P-doped) and the substrate 105 or epi layer 108. The tilted trench implant utilizes a first conductivity type, e.g., p-type for power MOSFET device 100 that is exemplified as an NMOS device. Typically, a source contact trench may have an aspect ratio of at least 3 or above, and the implant parameters for a tilted implant including boron may comprise a dose range from $1 \times 10^{14}$ to $5 \times 10^{15}$ cm$^{-2}$, an energy range from 20 keV to 60 keV, and an angle range from 5 to 25 degrees.

Based on the foregoing description, one skilled in the art will recognize that by providing a separate LDD FP 115A/115B, a depletion mode FET or transistor 131 is formed in the LDD region 129 that is in series with the source-down enhancement mode FET transistor 133 gated by the gate stack of the associated power MOSFET cell. A boundary region, interface or portion 141 forming between P-body 114 and N− LDD region 129 at the surface can be considered a node operative as a virtual source of the depletion mode FET 131 as well as a virtual drain of the enhancement mode FET 133. In other words, an example power MOSFET cell or device according to an embodiment of the present invention may be modeled as a structure where a channel 142 of the depletion mode FET 131 is directly connected to the channel of the enhancement mode FET 133. Accordingly, it may be visualized that the drain 132 of the whole power MOSFET cell, e.g., 110B, (which may comprise an N+ drain in NMOS implementation) is operative as the drain of the depletion mode MOSFET transistor 131, having LDD FP 111B as its gate over the channel region 142. As noted above, boundary node 141 of the N− LDD region 129 can be considered as a common node operating as or including the source of the depletion mode MOSFET 131 as well as the drain of the enhanced mode MOSFET 133, although they are not separately connected to any external voltages. The poly gate 111B (or optional stack 111B/113B) of the entire cell 110B is operative as the gate of the enhanced mode MOSFET 133. Likewise, the N+ source 127 of the entire cell 110B is operative as a source for the enhanced mode MOSFET 133. In similar fashion, a depletion mode MOSFET is also formed in the other mirror power MOSFET cell 110A because of the separate LDD FP 115A provided therein.

Skilled artisans will appreciate that disclosed MOSFETs have a form that resembles an LDMOS (Laterally Diffused MOSFET) structure, which in some embodiments may be implemented as an asymmetric power MOSFET designed for low on-resistance and high blocking voltage. As used herein, an LDMOS device may be deemed synonymous with a diffused metal oxide semiconductor (DMOS) device. Besides tungsten (W), the metal filler 122 may also comprise other refractory metals such as Ta, or a PGM such as Pt or Pd, their metal silicides, or metal alloys of such metals including Ti—W.

As noted above, although NMOS transistors are generally described herein, it should be clear to one having ordinary skill in the art to use the disclosure of the present patent application to also form PMOS transistors, by n-doped regions being substituted by p-doped regions and vice versa, with resulting structures being roughly analogous. For example, differences in disclosed NMOS vs. PMOS power MOSFET devices may involve using opposite types of doping, e.g., a P/P+ substrate for NMOS becomes an N/N+ substrate for PMOS, the source and drain regions being changed from N-type doping for NMOS to P-type doping for PMOS, and the body region being changed from P-type for NMOS to N-type for PMOS.

Accordingly, whereas an N-channel MOSFET cell structure including a source-down enhancement mode transistor 133 that is coupled to an N-channel depletion mode transistor 131 is being exemplified as part of a power MOSFET cell, e.g., cell 110B, one skilled in the art having reference to this patent application will appreciate that P-channel devices and/or drain-down architectures may also be utilized with appropriate polarity changes in a power MOSFET implementation, mutatis mutandis, according to the teachings herein.

Figure 5:
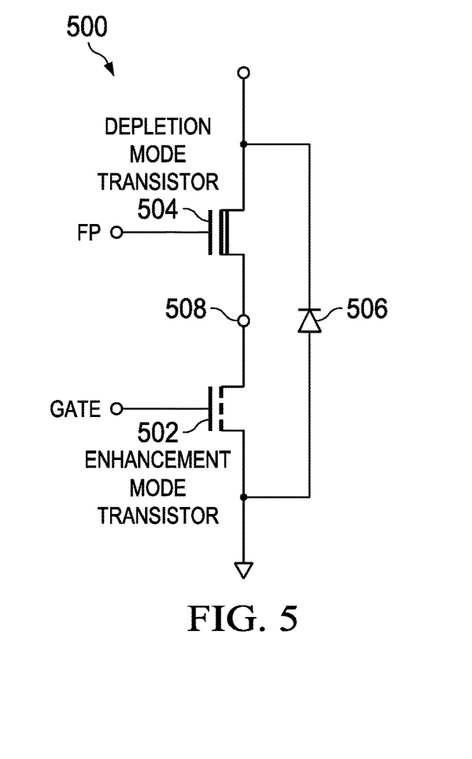
FIG. 5 is an electrical circuit diagram of an example power MOSFET integrated circuit that employs a switchably connectable field plate over an LDD region according to the teachings of the present invention in an example implementation.

Taking a single power MOSFET cell 110A/110B as an example, an equivalent electrical circuit 500 corresponding thereto is shown in FIG. 5 as an integrated circuit that employs a switchably connectable field plate over an LDD region according to the teachings of the present invention in an example implementation. A depletion mode transistor 504 is coupled in series to an enhancement mode transistor 502 at a common node 508 as described hereinabove, wherein a reverse-biased body-drift diode 506 is illustrative of a drain-source junction breakdown diode that is fabricated into the power MOSFET device.

Figure 6A:
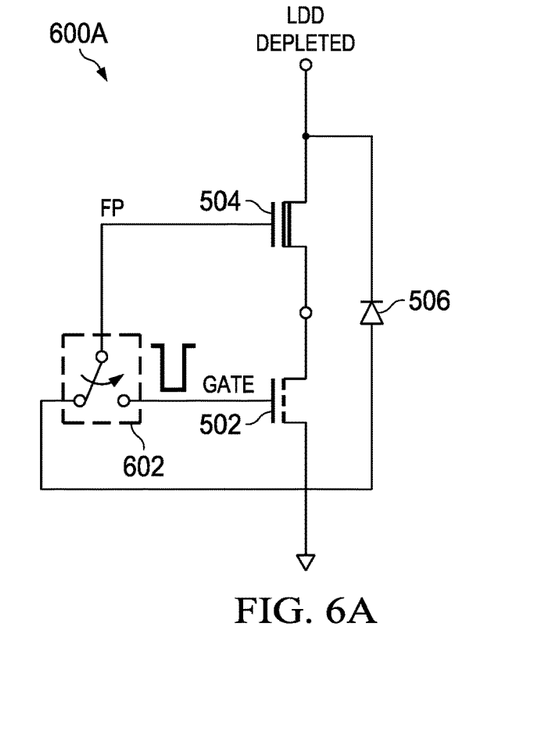
FIG. 6A is an electrical circuit diagram of an example power MOSFET integrated circuit in association with a high-level control circuit for controlling the power MOSFET in an OFF state according to one embodiment.

As the FP gate of the depletion mode transistor 504 is electrically isolated from the source FP structures, it can be biased at different voltage levels in order to advantageously operate a power MOSFET IC device with improved performance and/or electrical characteristics. A control circuit may be provided, which may be integrated with a power MOSFET device or associated otherwise, that can selectively switch the LDD FP gate of the depletion mode transistor 504 depending on whether the power MOSFET device is in ON state or OFF state. FIG. 6A is an electrical circuit diagram 600A of an example power MOSFET integrated circuit in association with a high-level control circuit 602 for controlling the power MOSFET in an OFF state according to one embodiment. In the OFF state, there is no gate potential applied to the enhancement mode transistor 502 (i.e., the power MOSFET gate is at a logic low level) and the LDD FP gate is connected to the source of the power MOSFET device. In this configuration, the power MOSFET device of the present invention operates similar to conventional source-down power MOSFET devices where a source FP is typically always biased to the source reference, e.g., ground. The LDD region of the depletion mode transistor 504 is depleted, which will block the drain voltage, thereby ensuring that the power MOSFET device meets its breakdown voltage targets. Accordingly, one skilled in the art will recognize that embodiments of the present invention continue to exhibit desirable high breakdown voltage characteristics of example power MOSFET implementations such as NexFET™ devices manufactured by Texas Instruments, Inc.

Figure 6B:
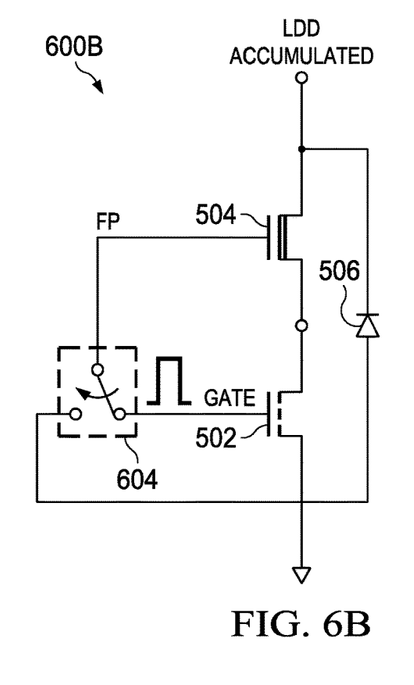
FIG. 6B is an electrical circuit diagram of an example power MOSFET integrated circuit in association with a high-level control circuit for controlling the power MOSFET in an ON state according to one embodiment.
Figure 6C:
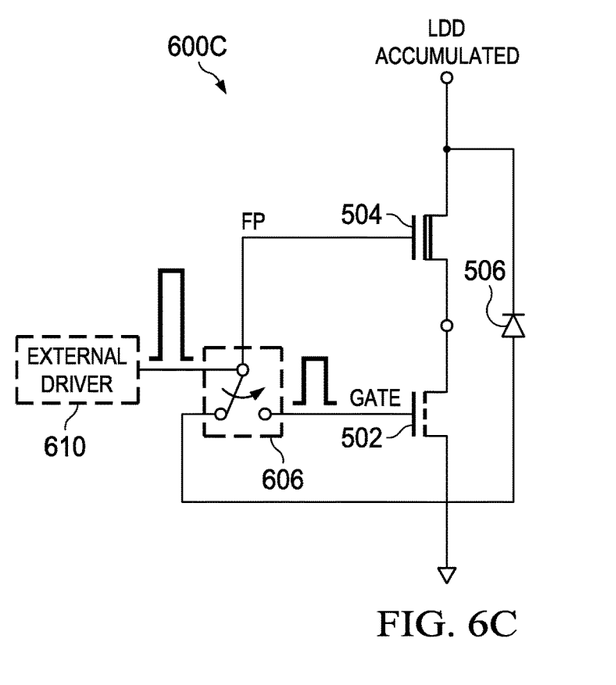
FIG. 6C is an electrical circuit diagram of an example power MOSFET integrated circuit in association with a high-level control circuit for controlling the power MOSFET in an ON state according to another embodiment.

FIG. 6B is an electrical circuit diagram 600B of an example power MOSFET integrated circuit in association with a high-level control circuit 604 for controlling the power MOSFET in ON state according to one embodiment. In this embodiment, the LDD FP gate of the depletion mode transistor 504 is switchably connected to the poly gate of the enhancement mode transistor, which is now turned on by a positive bias applied to the gate (i.e., the gate is at a logic high). The surface of the LDD region (e.g., LDD 129 shown in FIG. 1) is therefore positively biased into accumulation region and the specific on-state resistance ($R_{SP}$, which is device area multiplied by on-state resistance $R_{DSON}$) is further reduced. In another embodiment, the LDD FP gate of the depletion mode transistor 504 is switchably connected to a separate high voltage source driven or supplied by an external driver 610 when the power MOSFET device is turned ON, as shown in the electrical circuit diagram 600C of FIG. 6C. Because the LDD FP gate is separately connected to an external supply, a voltage higher than the gate voltage of the power MOSFET device can be applied to the LDD FP gate, which causes the resistance in the LDD region to be still further reduced.

Figure 2:
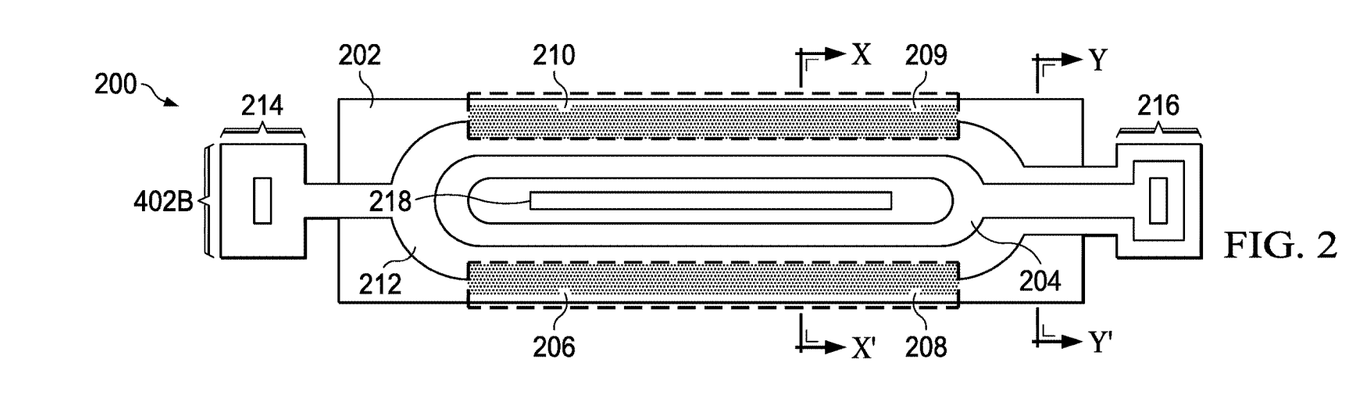
FIG. 2 depicts a layout diagram of an example power MOSFET cell according to an embodiment of the present invention.

Turning to FIG. 2, depicted therein is a layout diagram 200 (e.g., in top plan view) of an example N-channel power MOSFET repeating cell (or macro cell comprising two mirror-imaged MOSFET circuits) according to an embodiment of the present invention. A rectangular source FP structure 202 is associated with self-aligned N+ sources 206/210 of a pair of mirror-imaged individual cell portions, roughly analogous to cells 307A/307B shown in FIG. 3A, described in detail below. Also associated with the self-aligned N+ sources 206/210 are corresponding self-aligned source contacts 208/209. A poly gate layer 212 and an LDD FP layer 204 are provided in a race track configuration, with a gate contact 214 commonly associated with the two poly gate rails and an LDD FP contact 216 commonly associated with the two FP rails of the repeating cell. A drain contact 218 is provided for contacting the N+ drain in the LDD region, e.g., a metal plug, as set forth hereinabove with respect to FIG. 1.

Figure 3A:
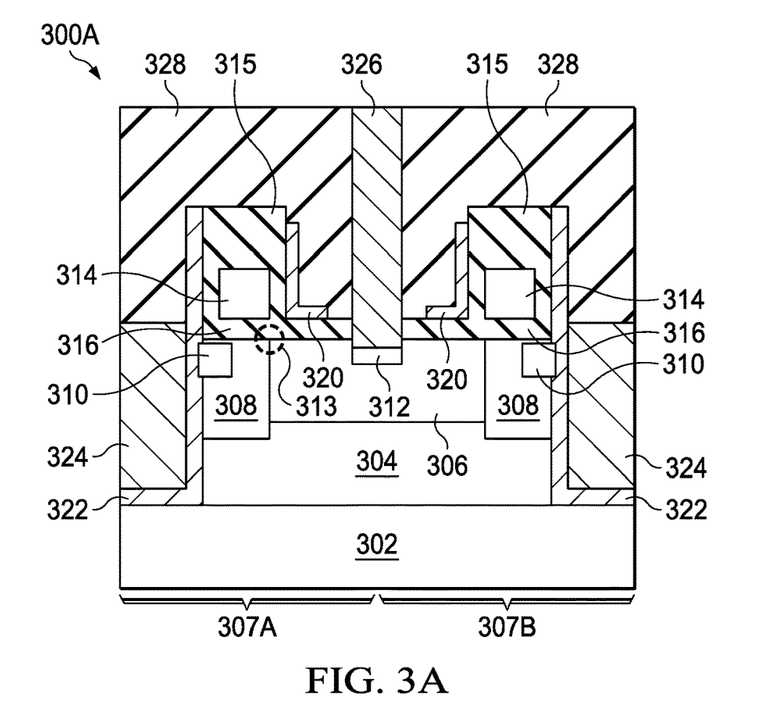
FIGS. 3A and 3B depict cross-sectional views of a portion of the power MOSFET cell layout shown in FIG. 2 at two different locations.
Figure 3B:
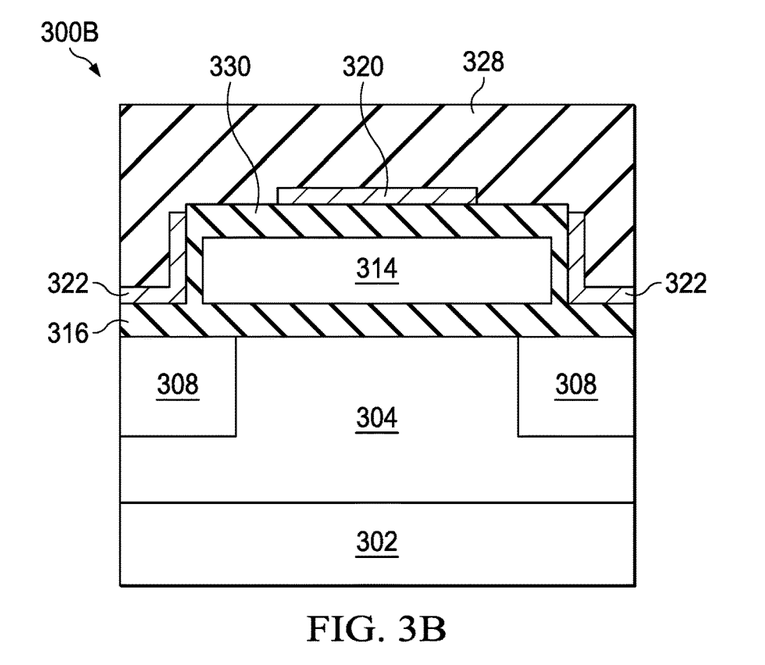

FIGS. 3A and 3B depict cross-sectional views of a portion of the power MOSFET cell layout 200 shown in FIG. 2 at two different locations. View 300A shown in FIG. 3A is representative of a cross-section taken at X-X' of the layout 200, which depicts cells 307A and 307B showing a common drain plug structure 326, e.g., formed of tungsten or other metallics. A P– epi layer 304 is formed over P+ substrate 302, which epi layer 304 has an N-LDD region 306 defined therein. Tungsten-filled source plugs 324 are formed in respective trenches, providing backside source contact to the substrate 302. In some implementations, there may be appropriate backside metallization as well for contacting with external circuitry.

A P-type body 308 surrounds an N+ source 310, associated with which is a source field plate 322 extending into the source plug trench. Although a single poly gate 314 is exemplified in the repeating cell structure 300A, it should be appreciated that a gate stack may be provided in an example power MOSFET device over a dielectric layer 316, similar to the embodiment illustrated in FIG. 1. An LDD field plate 320 is formed to one side of the oxide-covered poly gate 314 (e.g., a first insulating layer 315 formed over upper and sidewall surfaces of the poly gate 314), which is preferably formed in the same FP mask layer as the mask layer for forming source FP 322. A boundary node, region or portion 313 between the LDD region 306 and P-type body 308 is operative as a common node (analogous to boundary node 141 shown in the embodiment of FIG. 1) for coupling the enhancement mode and depletion mode transistors in series as set forth hereinabove. A TEOS dielectric layer 328 (e.g., a second insulating layer) is formed over the cells 307A/307B, through which common drain plug 326 is formed therebetween.

Another cross-sectional view 300B taken at Y-Y' of the layout 200 of FIG. 2 is shown in FIG. 3B, where LDD FP layer 320 is extended as an extension towards FP contact 216. As illustrated, an inter-level dielectric layer 330 may be provided between poly gate 314 and LDD FP extension 320.

Figure 4:
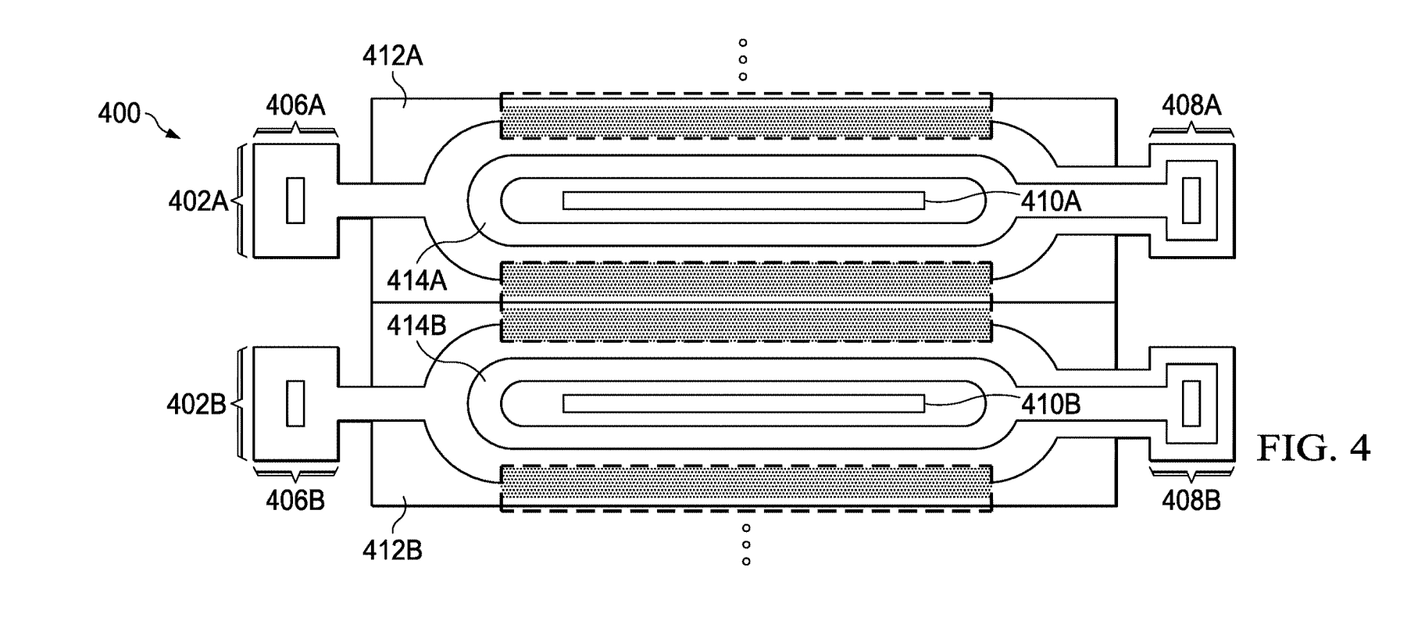
FIG. 4 depicts a layout diagram corresponding to a cell repeating arrangement that may be used for fabricating a power MOSFET device having a plurality of power MOSFET cells according to an embodiment of the present invention.

FIG. 4 depicts a layout diagram 400 corresponding to a cell repeating arrangement that may be used for fabricating a power MOSFET device having a plurality of power MOSFET repeating cells 402A/402B according to an embodiment of the present invention. Each repeating cell 402A/402B is provided with corresponding poly gate contacts 406A/406B, LDD FP contacts 408A/408B, respective source FPs 412A/412B, respective LDD FPs 414A/414B, and commonly tied source regions 404. Respective drain contacts 410A/410B may also be commonly tied, e.g., depending on an example power MOSFET implementation. As noted previously, hundreds or thousands of such repeating MOSFET cells may be coupled in parallel in an example power MOSFET device realization based on application.

Figures 7A, 7B, 8:
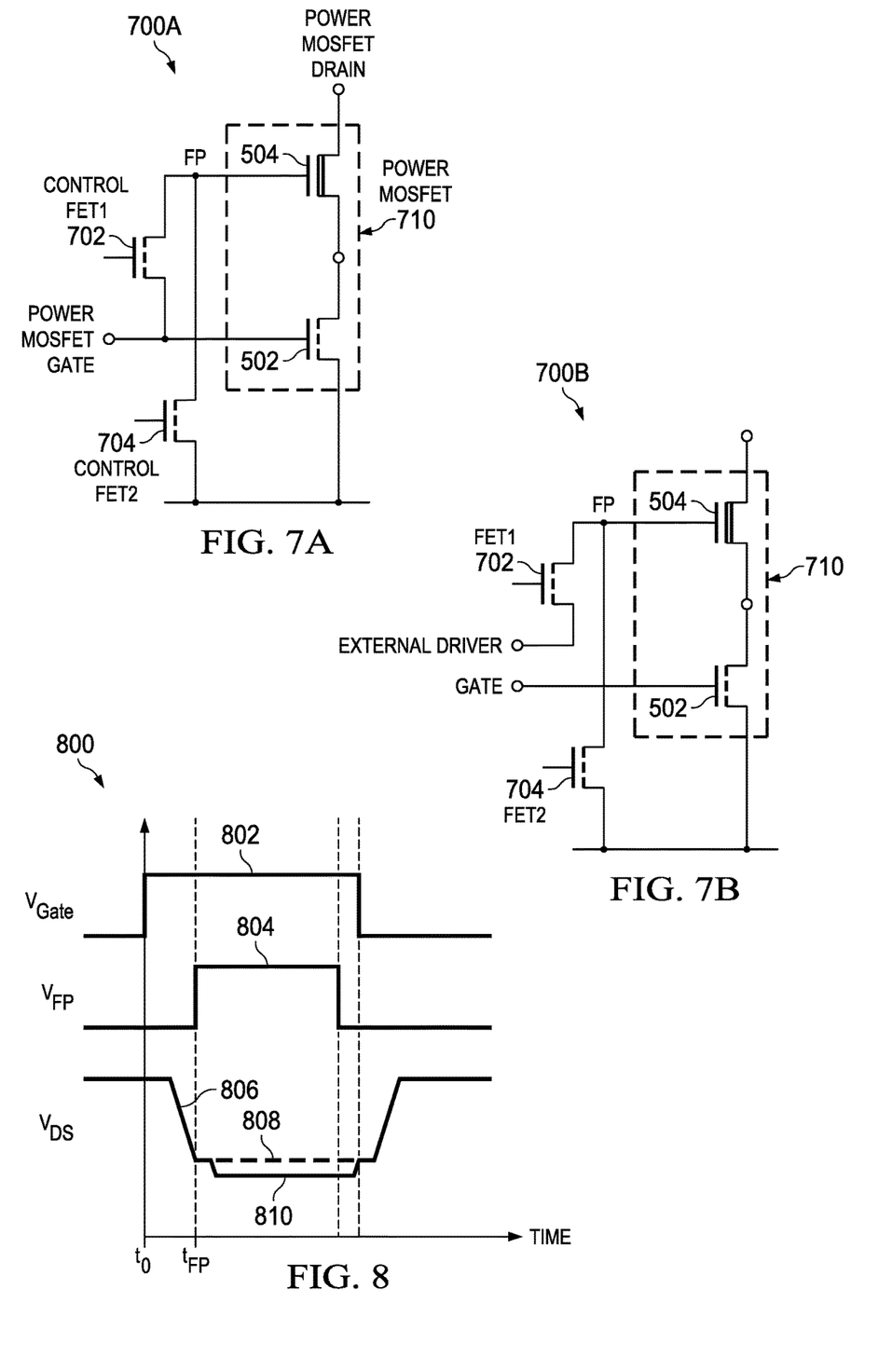
FIG. 7A is an electrical circuit diagram of an example power MOSFET integrated circuit in association with a particular implementation of a control circuit for controlling the power MOSFET according to the embodiment shown in FIGS. 6A and 6B.
FIG. 7B is an electrical circuit diagram of an example power MOSFET integrated circuit in association with a particular implementation of a control circuit for controlling the power MOSFET according to the embodiment shown in FIGS. 6A and 6C.
FIG. 8 is a timing diagram showing various waveforms associated with operation of an example power MOSFET device according to an embodiment of the present invention.

FIG. 7A depicts an electrical circuit diagram 700A of an example power MOSFET integrated circuit or device in association with a particular implementation of a control circuit for controlling the power MOSFET according to an embodiment. Control circuitry comprising a first control FET 702 and a second control FET 704 is provided to control the power MOSFET device 710 embodied as serially coupled depletion mode transistor 504 and enhancement mode transistor 502 in ON and OFF states. In OFF state of the power MOSFET device 710, control FET 704 is turned on (e.g., by applying a voltage greater than a threshold voltage of the FET), which couples the FP gate of the depletion mode transistor 504 to the source (similar to the arrangement shown in FIG. 6A). In this state, it should be appreciated that control FET 702 is turned off, thereby decoupling the FP gate of the depletion mode transistor 504 from the power MOSFET gate (which is at a logic low level). In other words, the logic levels provided to the respective gates of control FETs 702 and 704 are complementary to each other. In ON state of the power MOSFET device 710, control FET 704 is turned off, thereby decoupling the FP gate of the depletion mode transistor 504 from the source. On the other hand, control FET 702 is turned on, which couples the FP gate of the depletion mode transistor 504 to the power MOSFET gate that is at a logic high (similar to the arrangement shown in FIG. 6B).

In another embodiment 700B shown in FIG. 7B, control FET 702 may be selectively turned on so as to couple the FP gate of the depletion mode transistor 504 to an external driver (similar to the arrangement shown in FIG. 6C) instead of the power MOSFET gate. Aside from that, the functionality of control circuit arrangements in FIGS. 7A and 7B are roughly similar, although a decoupled external driver circuit may enable a higher voltage than the gate voltage of the power MOSFET device to be applied to the LDD FP, thereby causing or otherwise facilitating additional reduction in the LDD resistance as previously noted.

One skilled in the art will recognize that although separate control circuitry arrangements 602/604/606 have been exemplified in a high level configuration, FP switch control may be provided by a single circuit, e.g., comprising control FETs 702, 704, as set forth above in an example implementation, preferably configured to generate a suitable control signal or signals (e.g., responsive to respective gate control signals) for switchably coupling the FP gate as necessary depending on whether the device is powered off or on.

FIG. 8 is a timing diagram 800 showing various waveforms associated with operation of an example power MOSFET device according to an embodiment of the present invention. When the power MOSFET device is turned on at $t_0$ (e.g., by applying a gate voltage $V_{Gate}$ greater than the threshold voltage $V_T$), as exemplified by trace 802, the device starts conducting, with the drain-source voltage ($V_{DS}$) going to ground accordingly, as exemplified by trace 806. After a certain time has elapsed ($t_{FP}$), FP voltage ($V_{FP}$) of the depletion mode transistor is pulled high (as exemplified by trace 804), thereby biasing the LDD region into accumulation region. As the on-state resistance is further reduced, $V_{DS}$ is pulled to ground faster, giving rise to trace 810, which would be typically lower than the $V_{DS}$ trace 808 that would have otherwise obtained. Prior to turning off the power MOSFET device, the $V_{FP}$ drive is turned off or switched off, followed by taking the gate voltage $V_{Gate}$ to low. As a result, drain-source voltage $V_{DS}$ returns to a normal level.

Figure 9:
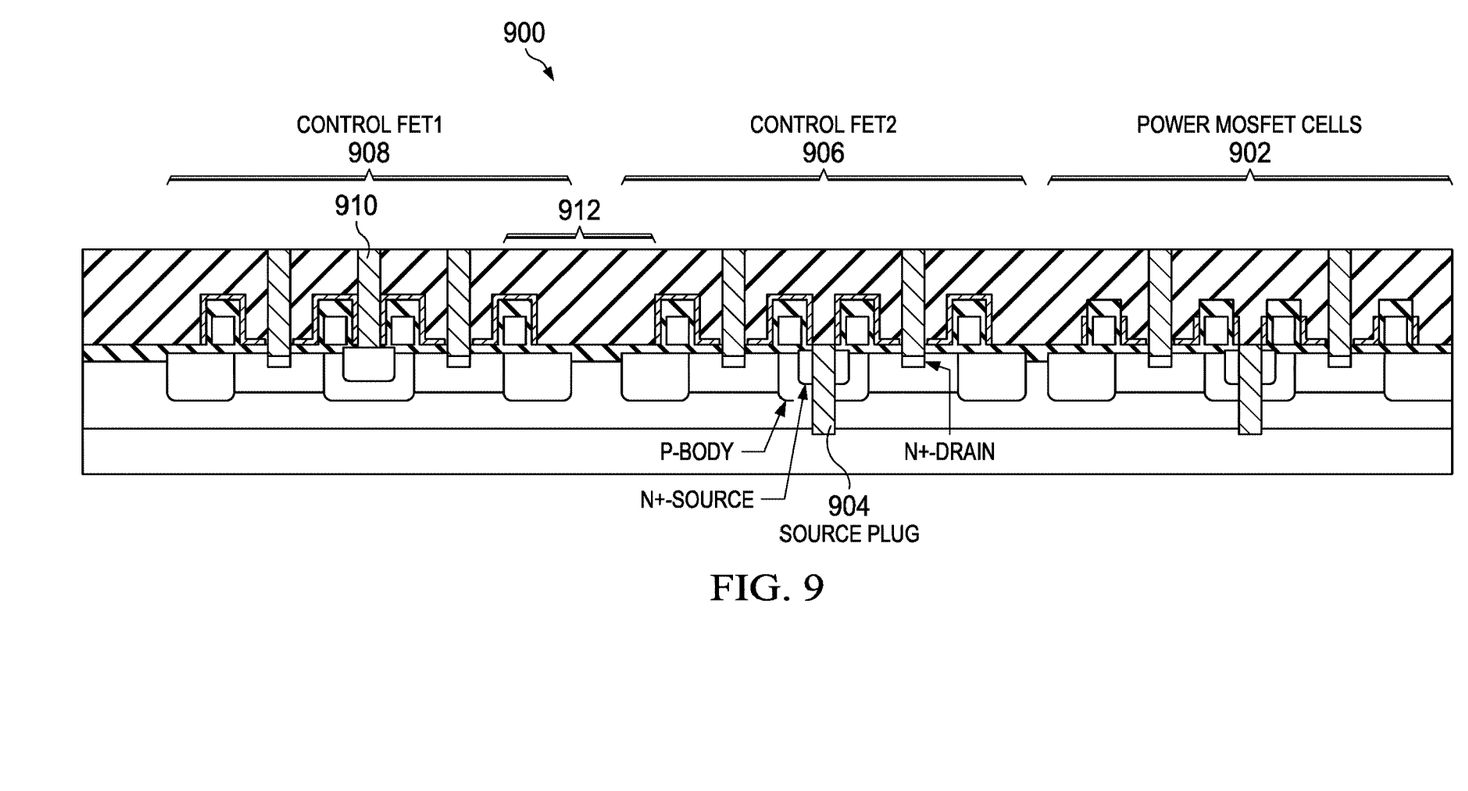
FIG. 9 depicts a cross-sectional view of an integrated power MOSFET device that includes control circuitry corresponding to the embodiments shown in FIG. 7A or 7B.

It should be appreciated that a control circuit involving control FETs 702 and 704 such as described above may be advantageously integrated into fabrication of a switched FP-based power MOSFET device according to an example embodiment. By way of illustration, a control FET (e.g., control FET 704) for coupling the LDD FP gate of the depletion mode transistor 504 to the source of source-down enhancement mode transistor 502 may be fabricated using essentially the same structure of a power MOSFET circuit but with the source FP structure extending over the gate to the LDD regions (i.e., without a switchable LDD FP portion), as may be provided in certain example NexFET™ process flows, wherein a deep SCT plug structure provided for control FET 704 can commonly tie its source to the source of power MOSFET device. On the other hand, since the control FET (e.g., control FET 702) is utilized an example embodiment for switchably coupling the LDD FP gate of the depletion mode transistor 504 to either the gate of power MOSFET device or an external voltage source (in the ON state), control FET 702 may be fabricated with a separate source contact to provide such switchable coupling. FIG. 9 depicts a cross-sectional view of an integrated power MOSFET embodiment 900 that illustrates control FETs 906, 908 in the same substrate as an example power MOSFET cell 902, wherein control FET 906 is provided with a source plug 904 for commonly tying to the power MOSFET's substrate in a source-down configuration. In contrast, control FET 908 is provided with a source contact 910 that is electrically isolated from the power MOSFET's source-down substrate. A diode termination 912 between control FETs 906, 908 is also illustrated in the example embodiment of FIG. 9.

Figure 10A:
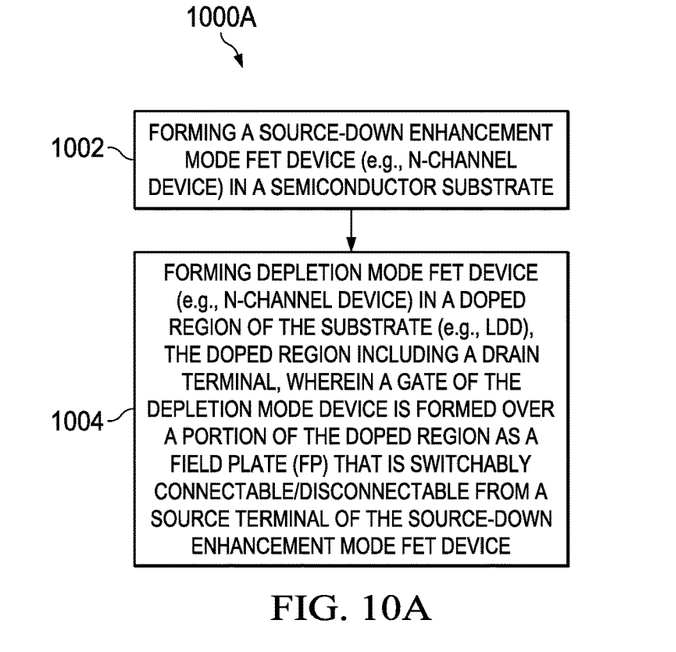
FIGS. 10A and 10B are flowcharts associated with a method of fabricating a power MOSFET integrated circuit according to an embodiment of the present invention.
Figure 10B:
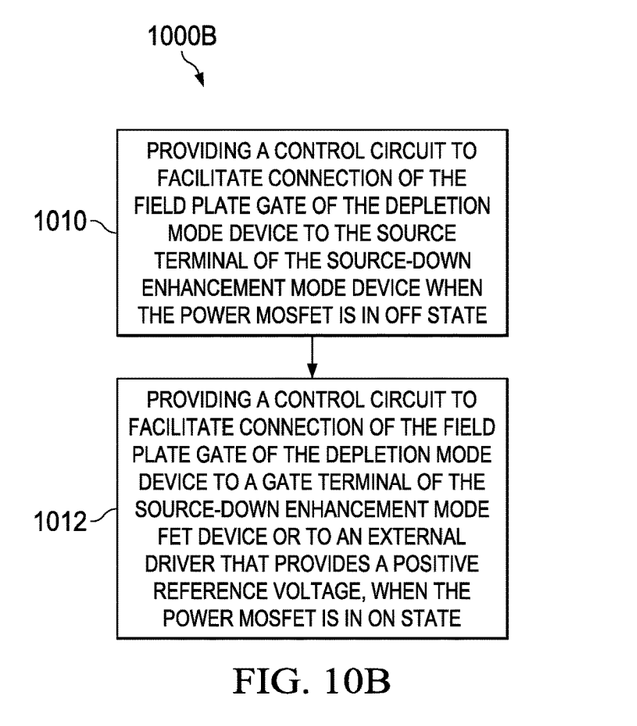

FIGS. 10A and 10B are flowcharts associated with a method of fabricating a power MOSFET integrated circuit according to an embodiment of the present invention. Process 1000A illustrated in FIG. 10A relates to forming a switchably connectable FP-based power MOSFET cell or IC in one implementation. At block 1002, a source-down enhancement mode FET device of a conductivity type (e.g., NMOS device) is formed in a semiconductor substrate. At block 1004, a depletion mode FET device (having the same conductivity type) is formed in a doped region (e.g., LDD) of the substrate, e.g., by electrically isolating or separating a field plate portion extended over the doped region from a source FP structure, the doped region including a drain terminal, wherein a gate of the depletion mode device is formed over a portion of the doped region as the isolated field plate that is switchably (dis)connectable from a source terminal of the source-down NMOS enhancement mode FET device. Process 1000B of FIG. 10B relates to providing suitable control circuitry for controlling a switchable FP-based power MOSFET device in one implementation. At block 1010, a first control circuit may be provided to facilitate connection of the FP gate of the depletion mode device to the source terminal of the source-down N-channel enhancement mode device when the power MOSFET is in OFF state. For example, a pair of control FETs may be configured to establish an electrical connection between the FP gate terminal of the depletion mode transistor and the source terminal of the source-down enhancement mode transistor responsive to a control signal provided when the power MOSFET cell circuit is in an OFF state as set forth previously. At block 1012, another control circuit may be provided to facilitate connection of the FP gate of the depletion mode device to a gate terminal of the source-down N-channel enhancement mode FET device or to an external driver that provides a positive reference voltage, when the power MOSFET is in ON state. As before, the pair of control FETs may be configured to establish an electrical connection between the gate terminal of the depletion mode transistor and an external driver circuit or the gate terminal of the source-down device in response to a control signal provided when the power MOSFET cell is in an ON state As one skilled in the art will recognize, example control circuits comprising FETs based on complementary logic may be integrated as a single control circuit as set forth above.

Based on the foregoing description, skilled artisans will recognize that embodiments disclosed herein advantageously provide an optimal trade-off between the breakdown voltage ($BV_{DSS}$) and specific on-state resistance ($R_{SP}$) in a power MOSFET device in order to provide improved operational efficiency and reliability in a variety of power applications including, e.g., DC-to-DC conversion applications. In addition, embodiments herein allow for more room to adjust and optimize doping density profiles in the LDD region so as to improve the hot carrier injection (HCI) performance without negatively impacting the $R_{SP}$ performance of the device. Further improvements may also be advantageously achieved by optimizing the oxide thickness under the LDD field plate structures provided in accordance with the teachings herein.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A power metal-oxide-semiconductor field effect transistor (MOSFET) integrated circuit, comprising:
   a semiconductor substrate;
   a source-down enhancement mode transistor formed in the semiconductor substrate;
   a depletion mode transistor formed in a doped region of the semiconductor substrate, the doped region including a drain terminal, and the depletion mode transistor and the source-down enhancement mode transistor coupled in series, the depletion mode transistor comprising a field plate; and
   a control circuit connected between the field plate and a source terminal of the source-down enhancement mode transistor.

2. The power MOSFET integrated circuit as recited in claim 1, wherein the source-down enhancement mode transistor and the depletion mode transistor each comprise an N-channel FET.

3. The power MOSFET integrated circuit as recited in claim 1, wherein the field plate is operative as a gate terminal formed over at least a portion of a LDD region.

4. The power MOSFET integrated circuit as recited in claim 3, wherein the control circuit is configured to establish an electrical connection between the gate terminal of the depletion mode transistor and the source terminal of the source-down enhancement mode transistor responsive to a control signal provided when the power MOSFET integrated circuit is in an OFF condition.

5. The power MOSFET integrated circuit as recited in claim 3, wherein the control circuit is configured to establish an electrical connection between the gate terminal of the depletion mode transistor and a gate terminal of the source-down enhancement mode transistor responsive to a control signal provided when the power MOSFET integrated circuit is in an ON condition.

6. The power MOSFET integrated circuit as recited in claim 3, wherein the control circuit configured to establish an electrical connection between the gate terminal of the depletion mode transistor and an external driver circuit responsive to a control signal provided when the power MOSFET integrated circuit is in an ON condition.

7. The power MOSFET integrated circuit as recited in claim 3, wherein the field plate of the depletion mode transistor masking to define a source field plate coupled to the source terminal of the source-down enhancement mode transistor.

8. The power MOSFET integrated circuit as recited in claim 1, wherein the depletion mode transistor and the source-down enhancement mode transistor are coupled at a boundary interface between the doped region and a body region of the source-down enhancement mode transistor, the boundary interface including a source of the depletion mode transistor and a drain of the enhancement mode transistor.

9. A method of fabricating a power metal-oxide-semiconductor field effect transistor (MOSFET) integrated circuit, the method comprising:
   forming a source-down enhancement mode transistor in a semiconductor substrate; and
   forming a depletion mode transistor in a doped region of the semiconductor substrate, the doped region including a drain terminal, and the depletion mode transistor and the source-down enhancement mode transistor coupled in series, wherein a gate terminal of the depletion mode transistor is formed over at least a portion of the doped region as a field plate that is connected to a control circuit to switchably connect the field plate to a source terminal of the source-down enhancement mode transistor.

10. The method as recited in claim 9, wherein the source-down enhancement mode transistor is formed as an N-channel FET.

11. The method as recited in claim 10, wherein the depletion mode transistor is formed as an N-channel FET.

12. The method as recited in claim 10, wherein the control circuit is configured to establish an electrical connection between the gate terminal of the depletion mode transistor and the source terminal of the source-down enhancement mode transistor responsive to a control signal provided when the power MOSFET integrated circuit is in an OFF condition.

13. The method as recited in claim 10, wherein the control circuit is configured to establish an electrical connection between the gate terminal of the depletion mode transistor and a gate terminal of the source-down enhancement mode transistor responsive to a control signal provided when the power MOSFET integrated circuit is in an ON condition.

14. The method as recited in claim 10, wherein the control circuit is configured to establish an electrical connection between the gate terminal of the depletion mode transistor and an external driver circuit responsive to a control signal provided when the power MOSFET integrated circuit is in an ON condition.

15. The method as recited in claim 10, further comprising electrically coupling the depletion mode transistor and the source-down enhancement mode transistor at a boundary interface between the doped region and a body region of the source-down enhancement mode transistor is formed, the boundary interface including a source of the depletion mode transistor and a drain of the enhancement mode transistor.

16. A semiconductor device, comprising:
   a semiconductor substrate;
   a power MOSFET cell having a source-down enhancement mode transistor formed in the semiconductor substrate and a depletion mode transistor formed in a doped region of the semiconductor substrate, the source-down enhancement transistor and the depletion mode transistor coupled in series, the depletion mode transistor comprising a field plate operative as a gate terminal formed over at least a portion of the doped region; and
   a first control FET and a second control FET formed in the semiconductor substrate and both connected to the field plate, the first and second control FETs operative to control the field plate gate terminal of the depletion mode transistor depending on whether the power MOSFET cell is in an ON state or an OFF state, wherein a source of the first control FET is electrically isolated from a source of the power MOSFET cell and a source of the second control FET is commonly tied to the source terminal of the power MOSFET cell.

17. The semiconductor device as recited in claim 16, wherein the first and second control FET is configured to establish an electrical connection between the gate terminal of the depletion mode transistor and the source terminal of the source-down enhancement mode transistor responsive to a control signal provided when the power MOSFET cell circuit is in an OFF state.

18. The semiconductor device as recited in claim 16, wherein the first control FET is configured to establish an electrical connection between the gate terminal of the depletion mode transistor and a gate terminal of the source-down enhancement mode transistor responsive to a control signal provided when the power MOSFET integrated circuit is in an ON state.

19. The semiconductor device as recited in claim 16, wherein the first control FET is configured to establish an electrical connection between the gate terminal of the depletion mode transistor and an external driver circuit responsive to a control signal provided when the power MOSFET integrated circuit is in an ON state.

* * * * *